United States Patent [19]

Jastrzebski et al.

[11] Patent Number: 4,530,149
[45] Date of Patent: Jul. 23, 1985

[54] METHOD FOR FABRICATING A SELF-ALIGNED VERTICAL IGFET

[75] Inventors: Lubomir L. Jastrzebski, Plainsboro; Alfred C. Ipri, Princeton; Achilles G. Kokkas, Plainsboro, all of N.J.

[73] Assignee: RCA Corporation, Princeton, N.J.

[21] Appl. No.: 489,307

[22] Filed: Apr. 28, 1985

[30] Foreign Application Priority Data

Jun. 24, 1982 [GB] United Kingdom ............... 8218286

[51] Int. Cl.³ .......................................... H01L 21/205
[52] U.S. Cl. ................................... 29/571; 29/576 E; 29/578; 148/175; 148/187
[58] Field of Search ............... 29/571, 576 E, 578; 357/23 VD; 148/175, 187

[56] References Cited

U.S. PATENT DOCUMENTS

| | | | |
|---|---|---|---|
| 3,548,233 | 12/1970 | Cave et al. | 313/65 |
| 3,745,647 | 7/1973 | Boleky | 29/571 |
| 3,746,908 | 7/1973 | Engeler | 315/10 |
| 3,761,785 | 9/1973 | Pruniaux | 357/23 VD |
| 4,101,350 | 7/1978 | Possley et al. | 148/175 |
| 4,200,878 | 4/1980 | Ipri | 148/187 X |
| 4,252,579 | 2/1981 | Ho et al. | 148/175 X |
| 4,287,660 | 9/1981 | Nicholas | 29/571 |
| 4,400,411 | 8/1983 | Yuan et al. | 148/175 X |
| 4,402,128 | 9/1983 | Blackstone | 29/571 X |
| 4,462,847 | 7/1984 | Thompson et al. | 148/175 X |
| 4,466,173 | 8/1984 | Baliga | 29/571 |

FOREIGN PATENT DOCUMENTS 152306  12/1976  Japan .

OTHER PUBLICATIONS

Applied Physics Letters, vol. 16, No. 5, Mar. 1, 1970, The "Epicon" Array: A New Semiconductor Array-Type Camera Tube Structure, W. E. Engeler et al., pp. 202-205.
IEEE Transactions, vol. ED-18, No. 11, Nov. 1971, pp. 1036-1042, The Epicon Camera Tube: An Epitaxial Diode Array Vidicon, S. M. Blumfeld et al.
Nature, vol. 195, No. 4840, Aug. 4, 1962, pp. 485-486, Selective Epitaxial Deposition of Silicon, B. D. Joyce et al.

Primary Examiner—George T. Ozaki
Attorney, Agent, or Firm—Birgit E. Morris; Donald S. Cohen; Kenneth R. Glick

[57] ABSTRACT

A vertical IGFET device is formed on a substrate which includes a monocrystalline silicon portion at a surface thereof. An apertured insulated gate electrode is disposed on the substrate surface such that an area of monocrystalline silicon is exposed through the aperture. An epitaxial silicon region extends from the substrate surface within the gate electrode aperture and is appropriately doped such that a predetermined voltage applied to the insulated gate electrode forms a channel region in the epitaxial region adjacent thereto. The vertical IGFET is fabricated by a self-aligned technique, wherein the insulated gate electrode includes a first, underlying insulating layer and a second, overlying insulating layer. The second insulating layer protects the gate electrode when the first insulating layer is defined.

17 Claims, 9 Drawing Figures

METHOD FOR FABRICATING A SELF-ALIGNED VERTICAL IGFET

BACKGROUND OF THE INVENTION

The present invention relates to vertical insulated gate field effect transistors (IGFETs) which can be used in integrated circuit applications. Additionally, it relates to a method for fabricating such devices in a relatively simple manner.

The term vertical IGFET, as used herein, refers to a device wherein the transistor current flow is regulated along a direction which is perpendicular to the major surfaces of the substrate on which the device is disposed. Source, body and drain regions of the transistor are in an overlying relationship to one another, and an insulated gate substantially surrounds, and is contiguous with the body region. When the insulated gate is appropriately electrically biased, a conduction channel is formed between the source and drain regions in that portion of the body region adjacent to the insulated gate.

The vertical configuration of the source, body and drain regions in such a vertical IGFET intrinsically consumes less substrate surface area than does a lateral configuration. Thus, if the source, body and drain regions can be made suitably small, the resulting structure might advantageously be used in integrated circuits, where device packing density is a important consideration.

A vertical IGFET and the epitaxial lateral overgrowth (ELO) fabrication method is disclosed in copending U.S. patent application Ser. No. 439,563, VERTICAL IGFET WITH INTERNAL GATE AND METHOD FOR MAKING SAME, S. C. Blackstone et al., filed Nov. 5, 1982, now abandoned. The device disclosed therein, the preferred embodiment of which incorporates a plurality of parallel gates, is particularly suitable to power switching applications. Photolithographic limitations constrain the spacing, i.e. the packing density between neighboring gates.

We have now discovered a method, which uses conventionally available processing techniques, whereby the spacing between gates can be reduced by greater than an order of magnitude. The recognition of this space-reducing method led to the realization of a device structure which is well suited to application in integrated circuits.

SUMMARY OF THE INVENTION

A vertical IGFET device is formed on a substrate which includes a monocrystalline silicon portion at a surface thereof. An apertured insulated gate electrode is disposed on the substrate surface such that an area of monocrystalline silicon is exposed through the aperture. An epitaxial silicon region extends from the substrate surface within the gate electrode aperture and is appropriately doped such that a predetermined voltage applied to the insulated gate electrode forms a channel region in the epitaxial region adjacent thereto. The vertical IGFET is fabricated by a self-aligned technique, wherein the insulated gate electrode includes a first, underlying insulating layer and a second, overlying insulating layer. The second insulating layer protects the gate electrode when the first insulating layer is defined.

DETAILED DESCRIPTION

Figure 1:
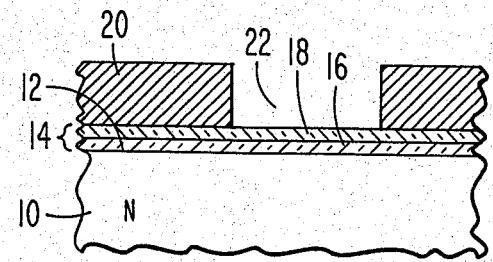
FIGS. 1-4 are sectional views of a processing sequence used to fabricate a vertical IGFET of the present invention.

FIG. 1 illustrates a convenient starting point for a description of the fabrication process of the present invention. A substrate 10, having a major surface 12, is initially provided. In the preferred embodiment, the substrate 10 is a monocrystalline silicon wafer of a first conductivity type. It will become apparent, however, that it is not necessary that the entire substrate 10 comprise monocrystalline material. It is critical only that that portion of the surface 12 where the FET is to be formed comprises monocrystalline silicon.

A first insulating layer 14 is formed across the substrate surface 12. The first insulating layer 14 might comprise, for example, silicon nitride or silicon dioxide, and it might be approximately 100-500 Angstroms thick. It can be conventionally formed, for example, by a chemical vapor deposition (CVD) process. However, in the preferred embodiment, as illustrated in FIG. 1, the first insulating layer comprises a lower layer 16 disposed on the surface 12 and an upper layer 18 disposed on the lower layer 16. The lower layer 16 comprises silicon dioxide, approximately 100-500 Angstroms thick, and the upper layer 18 comprises silicon nitride, approximately 100-500 Angstroms thick. The silicon dioxide lower layer 16 might be formed by thermal oxidation, and the silicon nitride upper layer 18 might be formed by CVD.

This two layer arrangement is preferable to a single, silicon nitride first insulating layer 14 because deposition of silicon nitride directly on the surface of a silicon substrate can introduce crystalline defects in the substrate. By incorporating a silicon dioxide lower layer 16 between the silicon nitride upper layer 18 and the silicon substrate surface 12, this source of defects is eliminated. This two layer arrangement may also be preferable to a single, silicon dioxide first insulating layer 14 because it may provide more flexibility in subsequent processing.

A layer of electrode material is then formed and defined on the surface of the first insulating layer 14 so as to form a gate electrode 20 having an aperture 22 therein. When the entire substrate surface 12 is not monocrystalline silicon, but rather includes a portion of monocrystalline silicon, the aperture 22 overlies a portion of the monocrystalline silicon portion. In the preferred embodiment, the electrode material is N+ doped polycrystalline silicon, and it is deposited and defined by a conventional sequence such as CVD, phosphorus doping and photolithographic processing. The thickness of the electrode 20 will ultimately provide the channel length of the vertical FET, and thus it might be in the range of approximately 2000-50,000 Angstroms. The lateral dimensions of the aperture 22 will ultimately determine the number of vertical IGFETs which can be packed into a particular area of the major surface 12.

Using conventional photolithographic pattern generation techniques to form the electrode 20, an aperture 22 with dimensions in the 1 to 3 micron range is readily obtainable.

Figure 2:
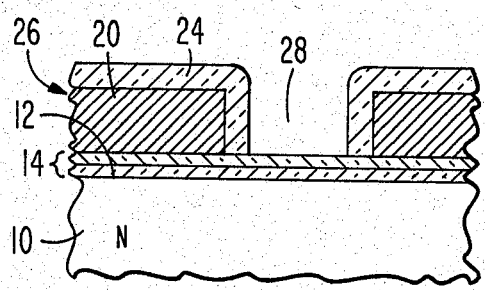

As illustrated in FIG. 2, the electrode 20 is next coated with a second insulating layer 24. In the preferred embodiment, the second insulating layer 24 is silicon dioxide, and it is formed by thermally oxidizing the polycrystalline silicon electrode 20 to a thickness of approximately 100–1,000 Angstroms. The apertured gate electrode 20 with the overlying second insulating layer 24 and underlying first insulating layer 14 is now referred to as an insulated gate 26. It should be noted that the aperture 22 in the gate electrode 20 of FIG. 1 is now reduced in size by approximately the thickness of the second insulating layer 24, since the insulating layer 24 extends along the aperture walls of the gate electrode 20. The aperture in the insulated gate 26 is now referred to at 28.

Figure 3:
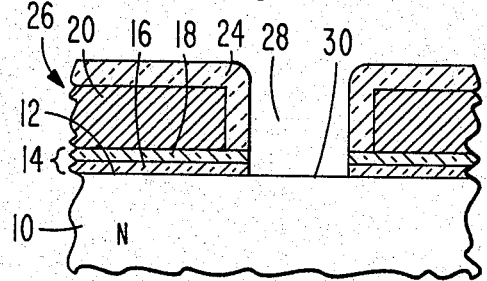

As illustrated in FIG. 3, that portion of the first insulating layer 14 exposed within the aperture 28 is now removed so as to expose a monocrystalline silicon area of the substrate surface 12 which will hereinafter be referred to as a nucleation site 30. Since, in the preferred embodiment, the material of the second insulating layer 24 is different from that of the upper layer 18, upper layer 18 can be selectively removed, with no further masking, by merely choosing an appropriate etchant. For example, the silicon nitride upper layer 18 (or a single, silicon nitride first layer 14) can be removed by immersion in hot phosphoric acid. This etchant will not attack the silicon dioxide second insulating layer 24 or the underlying electrode 20. The silicon dioxide lower layer 16 can then be removed by immersion in an etchant such as buffered HF. Although this etchant will also remove some portion of the silicon dioxide second insulating layer 24, the relative thickness of the second layer 24 and the lower layer 16 is such that a continuous coating of a particular thickness of the second layer 24 remains following the removal of the lower layer 16. Thus, the described etching process provides a self-aligning technique for locating the nucleation site 30 within the insulated gate aperture 28. No additional photolithographic steps are required to perform this alignment.

It should further be recognized that the insulated gate electrode 26 can be fabricated in a self-aligned manner even if the first insulating layer 14 and second insulating layer 24 are of the same material. This can be achieved by appropriately selecting the relative thicknesses of the two layers such that a predetermined thickness of the second insulating layer 24 remains following the removal of the first insulating layer from the nucleation site. Such a fabrication technique can be further enhanced by removing the first layer 14 with an anisotropic etching technique such as plasma or reactive ion etching.

Figure 4:
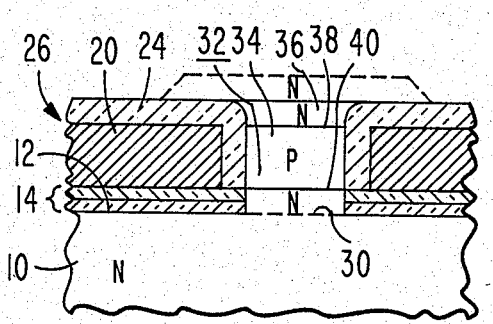

As illustrated in FIG. 4, monocrystalline epitaxial silicon 32 is next grown from the nucleation site 30 so as to fill the aperture in the insulated gate 26. Optimally, the growth of the epitaxial silicon 32 is terminated when it is substantially coplanar with the second insulating layer 24 which overlies the gate electrode 20. Alternatively, it can be terminated at some distance greater than the thickness of the insulated gate 26, such that the epitaxial silicon 32 overlies the second insulating layer 24, as shown by the broken line. The epitaxial silicon 32 can be formed by what is now referred to as the epitaxial lateral overgrowth (ELO) technique, as elaborated upon in copending U.S. patent applications Ser. No. 338,958, METHOD FOR GROWING MONOCRYSTALLINE SILICON ON A MASK LAYER, filed Jan. 12, 1982 by Corboy et al., and U.S. Pat. No. 4,482,422, METHOD FOR GROWING A LOW DEFECT MONOCRYSTALLINE SILICON LAYER ON A MASK, issued Nov. 13, 1984 to J. T. McGinn et al.

Basically, the ELO process involves a repetitious, two phase, deposition/etch cycle whereby monocrystalline silicon is grown from a monocrystalline silicon surface which is exposed within the aperture of an overlying mask. When the silicon which is being epitaxially deposited grows through the aperture to a thickness greater than that of the mask, the epitaxial growth proceeds laterally, across the surface of the mask, as well as vertically.

As elaborated upon in the cited patent applications, the deposition/etching cycle can be performed within a conventional reactor at atmospheric or reduced pressure. During the deposition phase of the cycle, the substrate is exposed to a gas mixture which comprises a silicon-source gas such as $SiH_2Cl_2$, a carrier gas such as hydrogen, and, optimally, a silicon-etching gas such as HCl. During the etching phase of the cycle, the substrate is exposed to a gas mixture comprising an etching gas such as HCl and a carrier gas such as hydrogen.

During the deposition phase, silicon deposits from the silicon-source gas onto exposed surfaces of the substrate 10 and second insulating layer 24. The silicon that deposits on the nucleation site 30 follows the monocrystalline lattice structure at that site, whereas the silicon which precipitates onto the second insulating layer 24 deposits in the form of isolated, non-single-crystalline aggregates. The gas composition and duration of the etching phase is designed so as to completely remove all the non-single-crystalline aggregates which are formed on the second insulating layer 24 following the deposition phase. Although this etching also removes some of the monocrystalline silicon growing from the nucleation site, the etch rate of the monocrystalline silicon is relatively low compared to the etch rate of the non-single-crystalline aggregates. Thus, after a single deposition/etching cycle, more silicon is deposited on exposed silicon surfaces during the deposition phase than is etched during the etching phase, and all of the deposited material is monocrystalline in nature.

The epitaxial silicon 32 is doped so as to form a second conductivity type portion, hereinafter body region 34, having a thickness substantially equal to that of the gate electrode 20, and a first conductivity portion, hereinafter source region 36, overlying the body region 34. The first conductivity type substrate 10 serves as a drain region in this structure, so as to form an FET with the source region 36 and body region 34.

A source/body PN junction 38 exists between the source region 36 and body region 34, and a body/drain PN junction 40 exists between the body region 34 and the substrate/drain region 10. Optimally, the body region 34 directly opposes the gate electrode 20. That is, the source/body junction 38 is substantially coplanar with the gate electrode 20/second insulating layer 24 interface where the second insulating layer 24 overlies the gate electrode 20, and the body/drain junction 40 is substantially coplanar with the interface between the gate electrode 20 and the first insulating layer 14.

It should be noted that the body/drain junction 40 is optimally not coplanar with the major substrate surface 12. Rather, it is displaced into the epitaxial region 32 by an approximate distance of from several hundred to several thousand Angstroms. This displacement occurs during the ELO deposition and during subsequent processing, due to out-diffusion of first conductivity type modifiers from the nucleation site 30 and autodoping from the deposition gas mixture. Both of these mechanisms are well understood in the semiconductor art, such that the precise location of the body/drain junction 40 can be manipulated by appropriately varying deposition parameters such as temperature, deposition gas pressure, and deposition rate.

The source and body regions can both be doped during the ELO deposition by introducing appropriate dopants to the deposition gas mixture as the epitaxial silicon is grown. Alternatively, rather than doping the source region 36 during the ELO process, it can be doped subsequently by, for example, ion implantation and/or diffusion.

The described configuration serves to facilitate channel formation in that area of the body region 34 contiguous with the insulated gate 26 when the insulated gate is appropriately electrically biased. The configuration minimizes feedback capacitance due to overlap between the gate electrode 20 and the source region 36 and/or the drain region 10. When an appropriate voltage is applied to the gate electrode 20, an inversion channel is created in the body region 34 in that area of the body region adjacent to the insulated gate 26. This channel is used to regulate current flow between the source region 36 and the substrate/drain region 10 during IGFET operation. In the case of an NPN device, wherein the body region 34 is of P type conductivity, a positive gate voltage will create an N type channel. Similarly, a negative gate voltage can be used to form the P type channel of a PNP device, wherein the body region 34 is of N type conductivity.

It should further be understood that all references herein to source and drain regions can be reversed. The substrate can equivalently be considered the source region, and the top portion of the epitaxial silicon can be considered the drain region.

Figure 5:
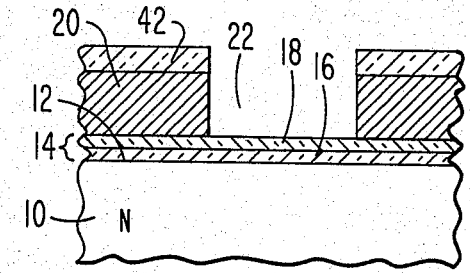
FIGS. 5-8 are sectional views of a second embodiment of the processing sequence. The vertical IGFET illustrated in FIG. 8 is an alternative embodiment to that shown in FIG. 4.

An alternative embodiment of the processing sequence described with reference to FIGS. 1-4 is illustrated in FIGS. 5-8. As shown in FIG. 5, a first conductivity type substrate/drain region 10 having a major surface 12 is again provided. A first insulating layer 14 having a lower layer 16 and upper layer 18 is disposed on the major surface 12 and a gate electrode 20 having an aperture 22 therein, is disposed on the first layer 14. Disposed on the top surface of the gate electrode 20, i.e. that surface which is substantially parallel to the substrate major surface 12 and which doesn't include the electrode surface within the aperture 22, is a supplementary insulating layer 42. Preferably, the supplementary layer 42 is silicon dioxide, and it is approximately 1000-5000 Angstroms thick. It can be formed by thermal oxidation or CVD, and it can be defined during the photolithographic sequence which is used to define the aperture 22. Such a photolithographic sequence might for example include the steps of forming an oxide layer on the polycrystalline silicon layer, forming a photoresist pattern on the oxide, etching the oxide, etching the polycrystalline silicon, and removing the photoresist.

Figure 6:
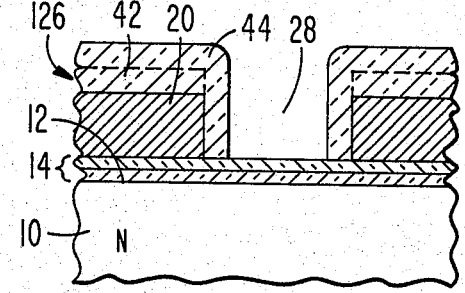

As shown in FIG. 6, a second insulating layer 44 is next formed over the electrode 20 and supplementary insulating layer 42. Again, the second insulating layer 44 coats the walls of the electrode 20 within the aperture, such that the aperture is now referred to at 28. In the alternative embodiment, the second insulating layer 44 is silicon dioxide, and it is formed by thermal oxidation so as to ensure growth on the walls of the aperture. The insulated gate, comprising the gate electrode 20, first insulating layer 14, supplementary insulating layer 42 and second insulating layer 44 is referred to at 126. It can be noted, that in the alternative embodiment, when both the supplementary insulating layer 42 and second insulating layer 44 are silicon dioxide, the thermal growth of the second insulating layer 42 will likely occur at the electrode 20/layer 42 interface, producing a structure wherein the supplementary layer 42 overlies the second insulating layer 44. Nonetheless, for clarity in the drawing, the second insulating layer 44 is shown overlying the supplementary insulating layer 42.

Figure 7:
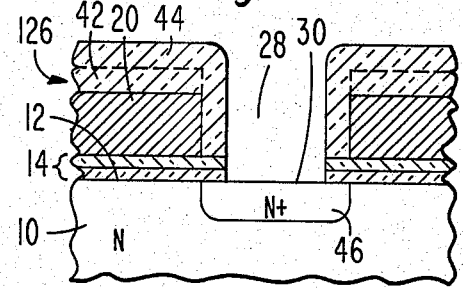

As illustrated in FIG. 7, the first insulating layer 14 is next removed from the substrate surface 12 so as to expose a monocrystalline silicon nucleation site 30. The removal can be performed by a procedure similar to that described with reference to FIG. 3. A high conductivity drain region 46 is then formed in the substrate/drain region 10, using the insulated gate 126 as a mask. The high conductivity drain region 46 is of first conductivity type, and it is of higher conductivity than the substrate/drain region 10. The high conductivity drain region 46 can conveniently be formed by ion implantation of an appropriate dopant so as to yield a region which extends into the substrate from the surface 12 to a thickness of from approximately several hundred Angstroms to several thousand Angstroms. Typically, following such an implantation, the dopant atoms are diffused so as to yield a region 46 which extends laterally beyond the periphery of the aperture 28.

Figure 8:
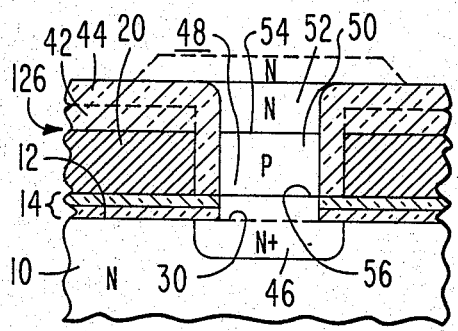

As illustrated in FIG. 8, monocrystalline epitaxial silicon 48 is next grown from the nucleation site 30 so as to fill the aperture 28 in the insulated gate 126. The epitaxial silicon may extend some distance vertically as well as laterally beyond the aperture 28, as shown by the broken line, and it can be grown by the previously described ELO technique. Again, that portion of the monocrystalline silicon 48 which opposes the gate electrode 20 is doped so as to form a body region 50 of second conductivity type. That portion of the monocrystalline silicon 48 overlying the body region 50 is doped so as to form a source region 52 of first conductivity type. A source/body PN junction 54 exists between the source and body regions, and a body/drain PN junction 56 exists between the body and high conductivity drain regions. As with the embodiment illustrated in FIGS. 1-4, the doping of the epitaxial silicon 48 can be preformed either during or subsequent to the ELO growth.

The two major differences between the embodiment of FIGS. 1-4 and the embodiment of FIGS. 5-8 are the formation of a high conductivity drain region 46, and the use of a supplementary insulating layer 42. It should be understood, however, that either of these process variations can readily be introduced into the sequence of FIGS. 1-4.

The use of a high conductivity drain region 46 enhances the electrical performance of the device formed. It is generally desirable to structure an FET wherein the source and drain regions are of relatively high conductivity compared with the body region therebetween. The ion implantation of FIG. 7 provides a means for increasing the conductivity of the substrate/drain region 10 relative to the body region 50. It should be recognized that although the relative conductivities between the source regions 52 and 36 and the body regions 50 and 34 have not been specified, the source regions will typically have dopant concentrations equivalent to that of the high conductivity drain region 46, and several orders of magnitude greater than those in the body regions.

As illustrated in the process sequence of FIGS. 5-8, the use of the supplementary insulating layer 42 creates a structure having a thicker source region 52. When the source region 52 laterally overlies the second insulating layer 44, this laterally overlying portion of the source region 52 is further separated from the gate electrode 20 than it is in the embodiment of FIG. 4. This reduces source to gate feedback capacitance during device operation. Although the growth of the epitaxial silicon 48 will optimally be terminated when the epitaxial silicon is coplanar with the surface of the second insulating layer 14, practical manufacturing considerations might militate that some lateral overgrowth onto the second insulating layer 44 occurs.

Figure 9:
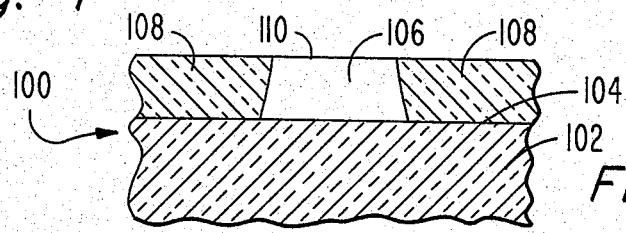
FIG. 9 represents a silicon-on-insulator substrate structure on which a vertical IGFET of the present invention can be fabricated.

Illustrated in FIG. 9 is an alternative embodiment for the substrate 10 of the two previous processing sequences. The substrate, designated at 100, is conventionally referred to as a silicon-on-insulator or silicon-on-sapphire (SOS) structure. In this embodiment, an insulating wafer 102, such as sapphire, having a major surface 104, is provided. Disposed on the surface 104 is a monocrystalline silicon island 106 which has a surface 110 and which is surrounded by silicon dioxide 108. The substrate 100 can be readily conventionally fabricated by, for example, depositing a monocrystalline silicon layer across the sapphire wafer surface 104, masking a portion of the monocrystalline silicon layer corresponding to the surface 110, oxidizing the unmasked silicon, and removing the mask from the surface 110. The substrate 100 can now be substituted for the substrate 10 in either of the previously described processing sequences. The monocrystalline silicon island surface 110 will substantially correspond to the nucleation site 30 in each of these sequences.

When incorporated into an integrated circuit, an IGFET of the present invention can comprise a variety of configurations. For example, a single gate electrode 20 having a plurality of apertures 22 might initially be disposed on the first insulating layer 14. Within each of the apertures 22, an individual FET can then be formed, such that each of the FETs have a common substrate/drain region 10. This sort of design might be suitable, for example, in a decoder, memory array, or binary logic configuration. Another exemplary integrated circuit configuration would comprise a plurality of insulated gate electrodes 26 on the surface of a substrate, with each insulated gate electrode including one or more FETs. Conventional microprocessor circuits having substantially higher packing densities could be fabricated in such a manner.

What is claimed is:

1. A method for fabricating a vertical IGFET device, comprising the steps of:
   (a) providing a substrate having a monocrystalline silicon drain portion of first conductivity type at a surface thereof;
   (b) forming a first insulating layer on said surface;
   (c) forming a gate electrode of predetermined thickness on the first insulating layer, the electrode having an aperture therethrough, said aperture overlying a portion of said monocrystalline silicon portion;
   (d) coating the apertured electrode with a second insulating layer so as to form an insulated gate;
   (e) etching the first insulating layer, using the insulated gate as an etch mask, so as to expose an area of monocrystalline silicon within the aperture of the insulated gate;
   (f) epitaxially growing silicon from said area of monocrystalline silicon so as to substantially fill the aperture; and
   (g) doping said epitaxial silicon so as to form a body region of second conductivity type in opposition to said gate electrode, and a source region of first conductivity type overlying said second conductivity type portion.

2. A method in accordance with claim 1, wherein said substrate is monocrystal line silicon.

3. A method in accordance with claim 1, wherein said first insulating layer is selected from the group consisting of silicon nitride and silicon dioxide.

4. A method in accordance with claim 1, wherein said first insulating layer comprises:
   a lower layer disposed on said substrate surface; and
   an upper layer disposed on said lower layer.

5. A method in accordance with claim 4, wherein said lower layer is silicon dioxide.

6. A method in accordance with claim 5, wherein said upper layer is silicon nitride.

7. A method in accordance with claim 1, wherein said gate electrode comprises doped, polycrystalline silicon.

8. A method in accordance with claim 7, wherein said gate electrode is formed by the steps of:
   forming a layer of doped polycrystalline silicon; and
   photolithographically defining said aperture.

9. A method in accordance with claim 7, wherein said gate electrode is formed by the steps of:
   forming a layer of doped polycrystalline silicon;
   forming a supplementary insulating layer on the surface of said polycrystalline silicon; and
   forming an aperture through said supplementary insulating layer and said polycrystalline silicon layer.

10. A method in accordance with claim 1, wherein said second insulating layer is silicon dioxide.

11. A method in accordance with claim 10, further comprising:
    providing a doped polycrystalline silicon gate electrode; and
    forming said second insulating layer by thermal oxidation so as to yield a predetermined thickness of said second insulating layer within said aperture in said electrode.

12. A method in accordance with claim 1, further comprising:
    between steps (e) and (f), doping said area of monocrystalline silicon exposed within said aperture.

13. A method in accordance with claim 12, comprising ion implanting a conductivity modifier of first conductivity type so as to achieve said doping.

14. A method in accordance with claim 1, further comprising doping said epitaxial silicon simultaneous with the growing thereof.

15. A method in accordance with claim 1, wherein said substrate comprises an insulating wafer having a layer disposed on a surface thereof, said layer comprising a monocrystalline silicon island surrounded by silicon dioxide.

16. A method in accordance with claim 15, wherein said substrate is formed by the steps of:
- forming a monocrystalline silicon layer on an insulating wafer;
- masking a portion of said silicon layer;
- oxidizing the unmasked portion of said silicon layer; and
- stripping said mask.

17. A method for fabricating a vertical IGFET device, comprising the steps of:
- (a) providing a substrate having a monocrystalline silicon source portion of first conductivity type at a surface thereof;
- (b) forming a first insulating layer on said surface;
- (c) forming a gate electrode of predetermined thickness on the first insulating layer, the electrode having an aperture therethrough, said aperture overlying a portion of said monocrystalline silicon portion;
- (d) coating the apertured electrode with a second insulating layer so as to form an insulated gate;
- (e) etching the first insulating layer, using the insulated gate as an etch mask, so as to expose an area of monocrystalline silicon within the aperture of the insulated gate;
- (f) epitaxially growing silicon from said area of monocrystalline silicon so as to substantially fill the aperture; and
- (g) doping said epitaxial silicon so as to form a body region of second conductivity type in opposition to said gate electrode, and a drain region of first conductivity type overlying said second conductivity type portion.

* * * * *

UNITED STATES PATENT AND TRADEMARK OFFICE
CERTIFICATE OF CORRECTION

PATENT NO. : 4,530,149

DATED : July 23, 1985

INVENTOR(S) : Lubomir L. Jastrzebski et al.

It is certified that error appears in the above-identified patent and that said Letters Patent is hereby corrected as shown below:

On the title page;

[22] Filed: "Apr. 28, 1985" should be --Apr. 28, 1983--.

Claim 2, line 2: "monocrystal line" should be --monocrystalline--.

Signed and Sealed this

Twenty-second Day of October 1985

[SEAL]

Attest:

Attesting Officer

DONALD J. QUIGG

Commissioner of Patents and Trademarks—Designate